(12) United States Patent
Cheng

(10) Patent No.: US 12,107,142 B2
(45) Date of Patent: Oct. 1, 2024

(54) METHOD FOR MANUFACTURING VERTICAL DEVICE

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 394 days.

(21) Appl. No.: 17/779,398

(22) PCT Filed: Nov. 2, 2020

(86) PCT No.: PCT/CN2020/125892
§ 371 (c)(1),
(2) Date: May 24, 2022

(87) PCT Pub. No.: WO2021/139366
PCT Pub. Date: Jul. 15, 2021

(65) Prior Publication Data
US 2022/0406918 A1    Dec. 22, 2022

(30) Foreign Application Priority Data
Jan. 10, 2020 (CN) .......................... 202010027027.5

(51) Int. Cl.
*H01L 29/66* (2006.01)
*H01L 21/306* (2006.01)
(Continued)

(52) U.S. Cl.
CPC .. *H01L 29/66212* (2013.01); *H01L 21/30625* (2013.01); *H01L 29/2003* (2013.01); *H01L 29/872* (2013.01)

(58) Field of Classification Search
CPC ......... H01L 29/66212; H01L 21/30625; H01L 29/2003; H01L 29/872
See application file for complete search history.

(56) References Cited

U.S. PATENT DOCUMENTS

| 1,052,986 | A | 2/1913 | Tucker |
| 10,529,867 | B1 * | 1/2020 | Ren .................... H01L 29/0615 |
| 2019/0305114 | A1 | 10/2019 | Niwa et al. |

FOREIGN PATENT DOCUMENTS

| CN | 108091683 A | 5/2018 |
| CN | 108899277 A | 11/2018 |
| CN | 110137267 A | 8/2019 |

OTHER PUBLICATIONS

ISA State Intellectual Property Office of the People's Republic of China, International Search Report Issued in Application No. PCT/CN2020/125892, Feb. 7, 2021, WIPO, 4 pages.
(Continued)

*Primary Examiner* — Monica D Harrison
*Assistant Examiner* — Christopher A Culbert
(74) *Attorney, Agent, or Firm* — The Small Patent Law Group LLC; Christopher R. Carroll

(57) ABSTRACT

The present disclosure provides a method for manufacturing vertical device. The method includes: forming a plurality of first grooves in the front side of the N-type heavily doped layer; forming an N-type lightly doped layer in the plurality of first grooves and on the front side of the N-type heavily doped layer; forming second grooves in the N-type lightly doped layer; forming a P-type semiconductor layer in the second grooves and on the front side of the N-type lightly doped layer; planarizing the P-type semiconductor layer; forming a passivation layer on the planarized structure; forming a third groove in the passivation layer, wherein the third groove has a depth equal to a thickness of the passivation layer; and forming a first electrode and a second electrode.

8 Claims, 7 Drawing Sheets

(51) Int. Cl.
  *H01L 29/20* (2006.01)
  *H01L 29/872* (2006.01)

(56) References Cited

OTHER PUBLICATIONS

ISA State Intellectual Property Office of the People's Republic of China, Written Opinion of the International Searching Authority Issued in Application No. PCT/CN2020/125892, Feb. 7, 2021, WIPO, 6 pages. (Submitted with Machine/Partial Translation).

* cited by examiner

METHOD FOR MANUFACTURING VERTICAL DEVICE

CROSS-REFERENCE TO RELATED APPLICATIONS

This application is a national phase entry of International Patent Application No. PCT/CN2020/125892 (filed 2 Nov. 2020), which claims priority to Chinese Patent Application No. 202010027027.5 (filed 10 Jan. 2020). The entire contents of these applications are incorporated by reference herein.

TECHNICAL FIELD

The present disclosure relates to the field of semiconductor, and in particular, to a method for manufacturing a vertical device.

BACKGROUND

At present, a semiconductor Schottky diode has the advantages of good reliability and easy circuit design, etc., and is widely used in the modern electronics industry, especially in the power electronic, the microwave radio frequency and other fields. An important technical indicator of the semiconductor Schottky diode is the diode reverse breakdown voltage, the diode reverse breakdown voltage limits the performance and reliability of the device.

In response to the demand for semiconductor devices with ultra-high integration, ultra-high speed, and ultra-low power used in increasingly miniaturized electronic devices, a vertical semiconductor Schottky diode has attracted more and more attention. In the production of vertical semiconductor Schottky diodes, many factors may affect the reverse breakdown voltage, for example, the use of etching process may cause adverse effects, such as structural inhomogeneity, increased defects in the epitaxial layer, and so on.

Therefore, how to further improve the reverse breakdown voltage of the vertical semiconductor Schottky diode is still a pressing problem to be solved.

SUMMARY

The present disclosure provides a method for manufacturing a vertical device, to increase the reverse breakdown voltage of the vertical device.

To this end, a method for manufacturing vertical device is provided according to embodiments of the present disclosure, the method includes: providing an N-type heavily doped layer having a front side and a back side opposite to the front side; forming a plurality of first grooves in the front side of the N-type heavily doped layer; forming an N-type lightly doped layer in the plurality of first grooves and on the front side of the N-type heavily doped layer; forming second grooves in a side of the N-type lightly doped layer away from the N-type heavily doped layer, wherein positions of the second grooves correspond to the plurality of first grooves; forming a P-type semiconductor layer in the second grooves and on a front side of the N-type lightly doped layer; planarizing the P-type semiconductor layer, during which a part of the P-type semiconductor layer located on the front side of the N-type lightly doped layer is removed and only a part of the P-type semiconductor layer located in the second grooves is retained; forming a passivation layer on the planarized structure; forming a third groove in the passivation layer, wherein the third groove is located on the part of the P-type semiconductor layer in the second grooves, and on the N-type lightly doped layer between two adjacent second grooves of the second grooves, and the third groove has a depth equal to a thickness of the passivation layer; forming a first electrode on a part of the passivation layer and in the third groove, to partially in contact with the part of the P-type semiconductor layer in the second groove, and to in contact with the N-type lightly doped layer between two adjacent second grooves of the second grooves; and forming a second electrode on the back side of N-type heavily doped layer.

Optionally, the second grooves are formed during growth of the N-type lightly doped layer.

Optionally, the N-type heavily doped layer has a doping concentration greater than $10^{18}/cm^3$, and the N-type lightly doped layer has a doping concentration less than $10^{18}/cm^3$.

Optionally, a buffer layer is provided between the N-type heavily doped layer and the N-type lightly doped layer.

Optionally, at the step of forming the third groove in the passivation layer, the third groove is formed by etching.

Optionally, the N-type heavily doped layer is a GaN-based material; and/or, the N-type lightly doped layer is a GaN-based material; and/or, the P-type semiconductor layer is a GaN-based material.

Optionally, materials of the N-type heavily doped layer, the N-type lightly doped layer and the P-type semiconductor layer are all the same or different from each other.

Optionally, chemical mechanical polishing is used to planarize the P-type semiconductor layer.

In the method for manufacturing vertical device according to the above embodiments, the N-type heavily doped layer and the N-type lightly doped layer are made, and a plurality of first grooves are on the front side of the N-type heavily doped layer, such that the second grooves is formed at the position corresponding to the first groove in the N-type lightly doped layer, the non-uniformity caused by etching and the impact on the epitaxial layer are reduced compared to the conventional manufacturing method, and thus the theoretical purpose of the design may be approached more closely, in the process of defect reduction, the conductive condition is reduced, i.e., the carriers are reduced, and the reverse breakdown voltage is increased. Meanwhile, the setting of P-type semiconductors and the presence of electrode field plates may attenuate the generation of an electric field spike, and thus the effect of reducing leakage is achieved.

LIST OF REFERENCE NUMERALS

Figure 1:
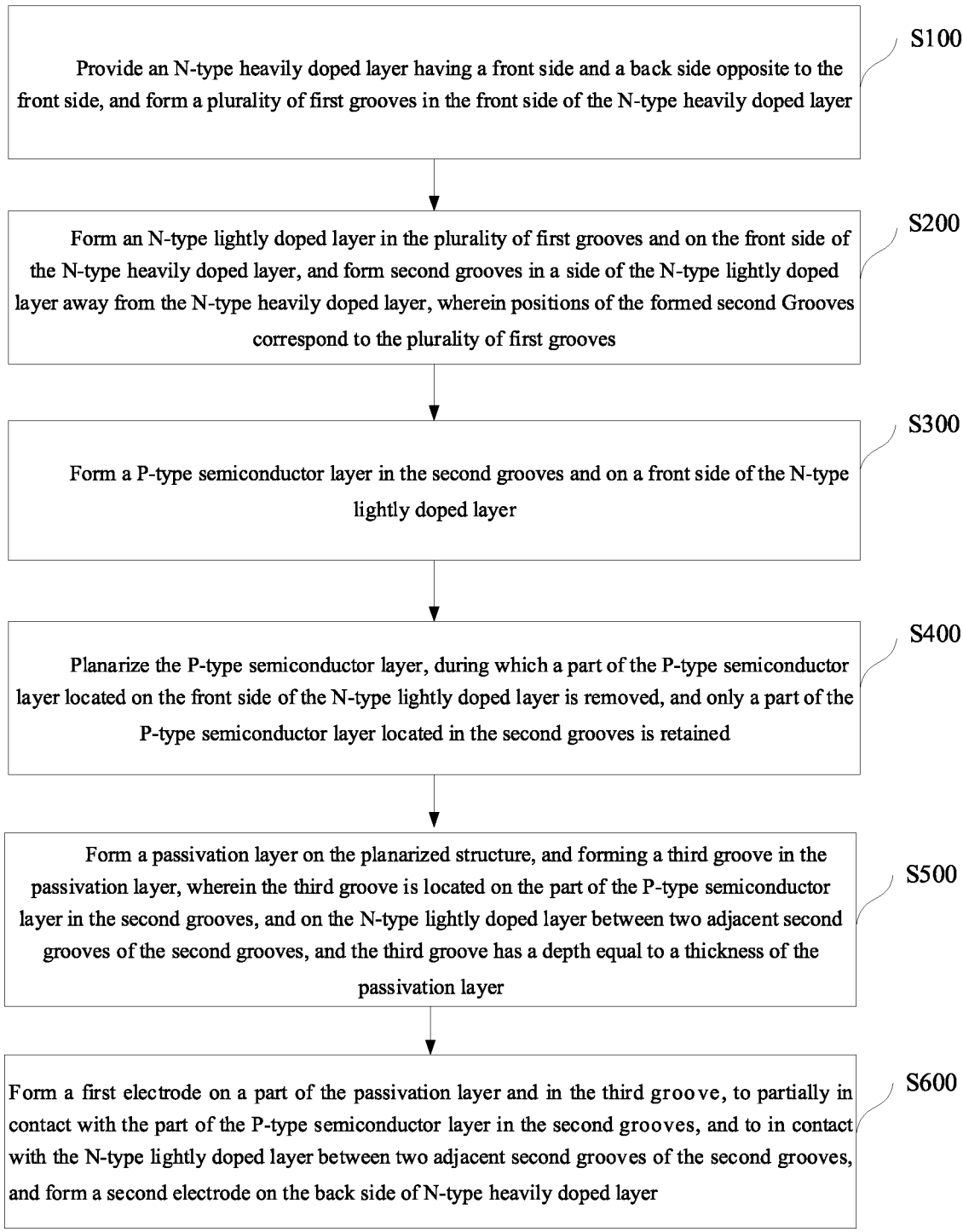
FIG. 1 is a flow chart illustrating a method for manufacturing a vertical device in accordance with embodiments of the present disclosure.

N-type heavily doped layer 11
Front side 11a of N-type heavily doped layer
Back side 11b of N-type heavily doped layer
First groove 12
N-type buffer layer 13
Front side of N-type buffer layer 13a
Buffer layer groove 131
N-type lightly doped layer 14
Front side 14a of N-type lightly doped layer
Second groove 15
P-type semiconductor layer 20
Passivation layer 30
Third groove 31
Anode 40
Cathode 50

DETAILED DESCRIPTION OF THE EMBODIMENTS

Exemplary embodiments will be described in detail herein, examples of which are illustrated in the drawings. Where the following description relates to the drawings, unless otherwise indicated, the same numerals in different drawings represent the same or similar elements. The implementations described in the following exemplary embodiments do not represent all implementation consistent with the present disclosure. On the contrary, the implementations are only examples of the device that is consistent with some aspects of the present disclosure as detailed in the appended claims.

The terms used in the present disclosure are for the purpose of describing particular embodiments only and are not intended to limit the present disclosure. Unless otherwise defined, technical terms or scientific terms used in the present disclosure shall have the ordinary meaning as understood by a person having ordinary skill in the art. Terms such as "a" or "an", and the like, used in the specification and claims of the present disclosure does not indicate a numerical limitation, but rather the presence of at least one. Terms such as "include" or "comprise", and the like, are intended to mean that an element or object appearing before "include" or "comprise" covers an element or object appearing after "include" or "comprise" and its equivalents, and do not exclude other elements or objects. Terms such as "connect" or "couple", and the like, are not limited to physical or mechanical connections, but may include electrical connections, whether directly or indirectly. A term "a plurality of" includes two, and is equivalent to at least two. The singular forms "a", "said" and "the" used in the specification and the appended claims are intended to include the plural forms as well, unless the context clearly indicates otherwise. It should also be understood that as used herein, the term "and/or" is and includes any or all combinations of one or more of the associated listed items.

First Embodiment

As shown in FIG. 1, and FIGS. 2(a) to 2(g), the embodiment provides a method for manufacturing a vertical device, the method includes step 100 to step 600.

At step 100, an N-type heavily doped layer having a front side and a back side opposite to the front side is provided, and a plurality of first grooves is formed in the front side of the N-type heavily doped layer.

At step 200, an N-type lightly doped layer is formed in the plurality of first grooves and on the front side of the N-type heavily doped layer, and second grooves are formed in a side of the N-type lightly doped layer away from the N-type heavily doped layer, wherein positions of the second grooves correspond to the plurality of first grooves.

At step 300, a P-type semiconductor layer is formed in the second grooves and on a front side of the N-type lightly doped layer.

At step 400, the P-type semiconductor layer is planarized, a part of the P-type semiconductor layer located on the front side of the N-type lightly doped layer is removed, and only a part of the P-type semiconductor layer located in the second grooves are retained.

At step 500, a passivation layer is formed on the planarized structure, and a third groove is formed in the passivation layer, wherein the third groove is located on the part of the P-type semiconductor layer in the second grooves, and on the N-type lightly doped layer between two adjacent second grooves of the second grooves, and the third groove has a depth equal to a thickness of the passivation layer.

At step 600, a first electrode is formed on a part of the passivation layer and in the third groove, to partially in contact with the part of the P-type semiconductor layer in the second grooves, and to in contact with the N-type lightly doped layer between two adjacent second grooves of the second grooves; and a second electrode is formed on the back side of N-type heavily doped layer.

Figure 2A:
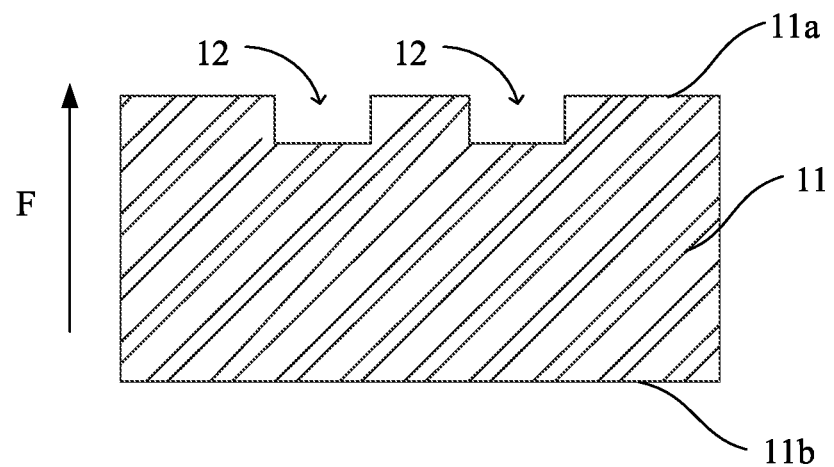
FIGS. 2(a) to 2(g) are a process flow diagram illustrating a method for manufacturing a vertical device in accordance with a first embodiment of the present disclosure.

At step 100, an N-type heavily doped layer 11 is provided as shown in FIG. 2(a), and the N-type heavily doped layer 11 has opposing a front side 11a and a back side 11b. A doping concentration of the N-type heavily doped layer 11 is greater than $10^{18}/cm^3$. After forming the N-type heavily doped layer 11, a plurality of first grooves 12 are formed by etching on the front side 11a of the N-type heavily doped layer 11. In the embodiment, the number of the first grooves 12 is not particularly limited, and it should be known to those skilled in the art that different numbers of first grooves 12 may be set according to different material parameters, in order to achieve the technical effect.

the N-type heavily doped layer 11 is a GaN-based material. The GaN-based N-type heavily doped layer 11 may be a single-layer structure or a stacking structure. The material of each layer may be GaN, AlGaN or AlInGaN, or other semiconductor materials including Ga atoms, N atoms, or a combination or mixture of at least two of these materials.

Figure 2B:
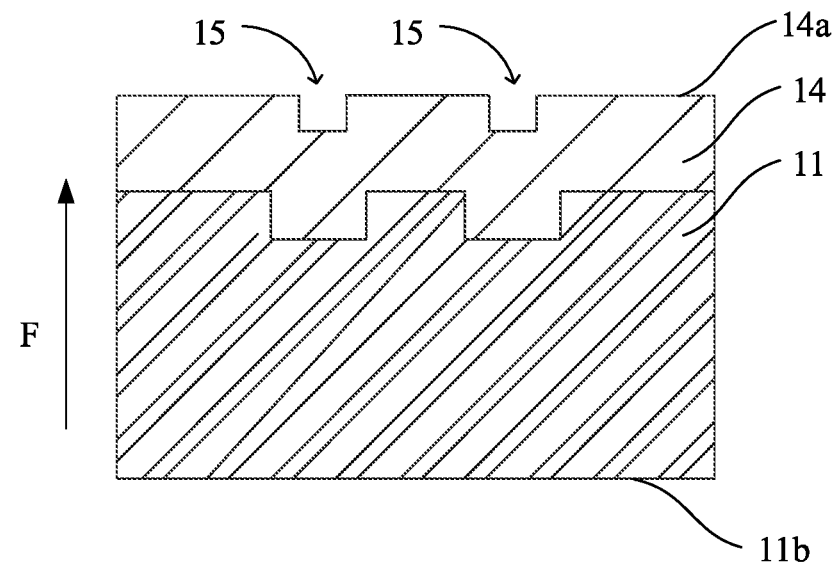

Successively, at step 200, as shown in FIG. 2(b), an N-type lightly doped layer 14 is formed along a growth direction F in the first groove 12 and on the front side 11a of the N-type heavily doped layer 11, and during the growth of the N-type lightly doped layer 14, second grooves 15 are formed in a side of the N-type lightly doped layer 14 away from the N-type heavily doped layer 11, i.e., the second grooves 15 are formed on a front side 14a of the N-type lightly doped layer 14. A doping concentration of the N-type lightly doped layer 14 is less than $10^{18}/cm^3$. The N-type lightly doped layer 14 grows to be form in the plurality of first grooves 12 and on the front side 11a of the N-type heavily doped layer 11, since the front side 11a of the N-type heavily doped layer 11 has the first grooves 12, and during the growth of the N-type lightly doped layer 14, the side of the N-type lightly doped layer 14 away from the N-type heavily doped layer 11 at positions corresponding to the first grooves 12 naturally grow to form the second grooves 15. That is, the number of the second grooves 15 is determined according to the number of the first grooves 12 and is the same as the number of first grooves 12. In addition, the number of the second grooves 15 may be flexible according to the number of the first grooves 12 described above.

the N-type lightly doped layer is a GaN-based material. The GaN-based N-type lightly doped layer 14 may be a single-layer structure or a stacking structure. The material of each layer may be GaN, AlGaN or AlInGaN, or other semiconductor materials including Ga atoms, N atoms, or a combination or mixture of at least two of these materials.

In this way, the second grooves 15 are formed during the growth of the N-type lightly doped layer 14 to reduce steps of etching, such that the non-uniformity caused by etching and the impact on the epitaxial layer are reduced, and thus the theoretical purpose of the design may be approached more closely, in the process of defect reduction, the conductive condition is reduced, i.e., the carriers are reduced, and the reverse breakdown voltage is increased.

Figure 2C:
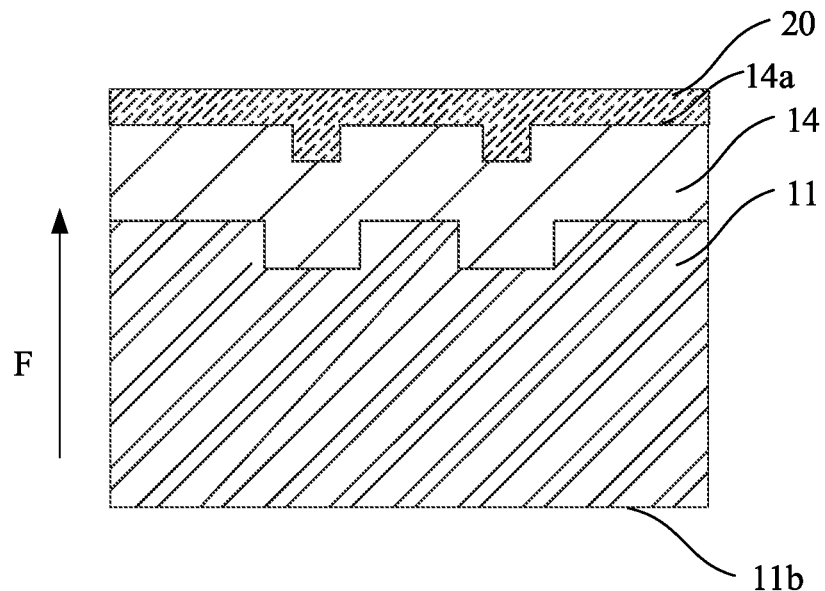

At step 300, a P-type semiconductor layer 20 is formed along the growth direction F in the second grooves 15 and on the front side 14a of the N-type lightly doped layer 14, as shown in FIG. 2(c). The P-type semiconductor layer 20 is a GaN-based material. The GaN-based P-type semiconductor layer 20 may be a single-layer structure or a stacking structure. The material of each layer may be GaN, AlGaN or AlInGaN, or other semiconductor materials including Ga atoms, N atoms, or a combination or mixture of at least two of these materials. The materials of the P-type semiconductor layer 20, the N-type heavily doped layer 11 and the N-type lightly doped layer 14 are all the same or different from each other.

Figure 2D:
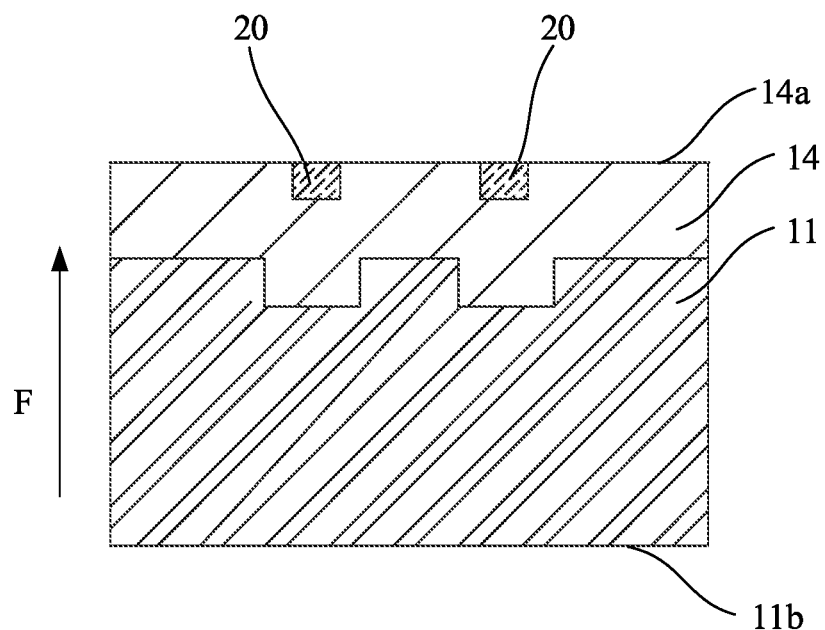

At step 400, as shown in FIG. 2(d), the P-type semiconductor layer 20 is planarized, the part of the P-type semiconductor layer 20 located on the front side 14a of the N-type lightly doped layer 14 is removed, and the part of the P-type semiconductor layer 20 in the second groove 15 is only retained. Wherein, chemical mechanical polishing is used to flatten the P-type semiconductor layer 20.

Figure 2E:
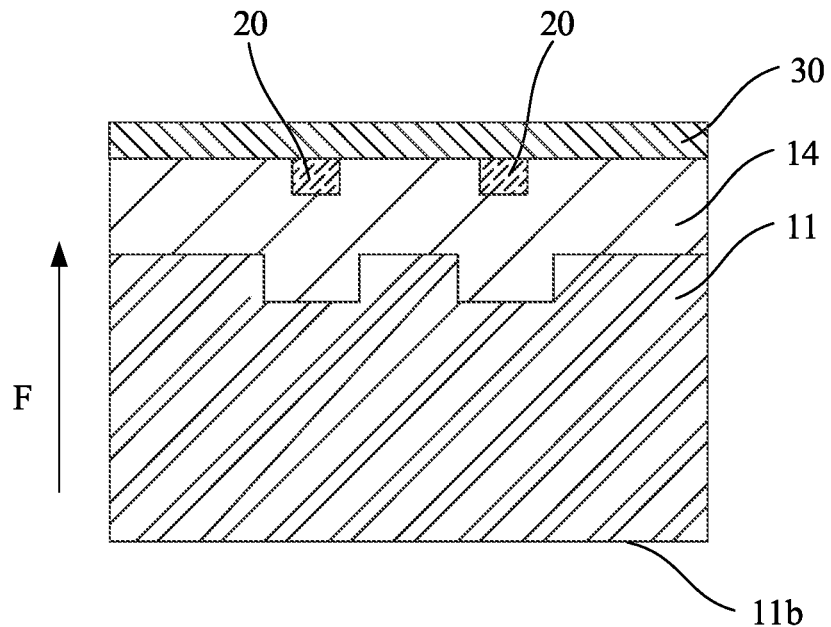

At step 500, as shown in FIG. 2(e), a passivation layer 30 is formed on the planarized structure, and the passivation layer 30 is formed on the P-type semiconductor layer 20 and on the front side 14a of the part of the N-type lightly doped layer 14. The passivation layer 30 is $SiO_2$, but not limited to $SiO_2$.

Figure 2F:
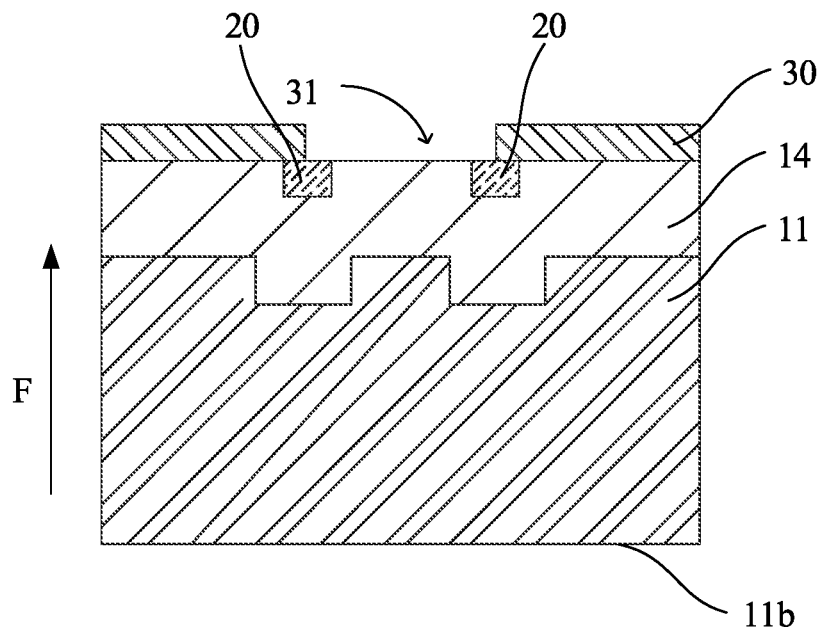

As shown in FIG. 2(f), at the step of forming a third groove 31 in the passivation layer 30, the method includes: forming, after forming the passivation layer 30, the third groove 31 by etching the passivation layer 30. the third groove 31 is positioned in the part of the P-type semiconductor layer 20 in the second grooves 15, and in the N-type lightly doped layer 14 between two adjacent second grooves 15, and the third groove 31 has a depth equal to a thickness of the passivation layer 30; Wherein, the number of the third grooves 31 is less than or equal to the number of gaps between the two adjacent second grooves 15. In addition, the number of the third grooves 31 may be flexible according to the number of the second grooves 15 described above.

Figure 2G:
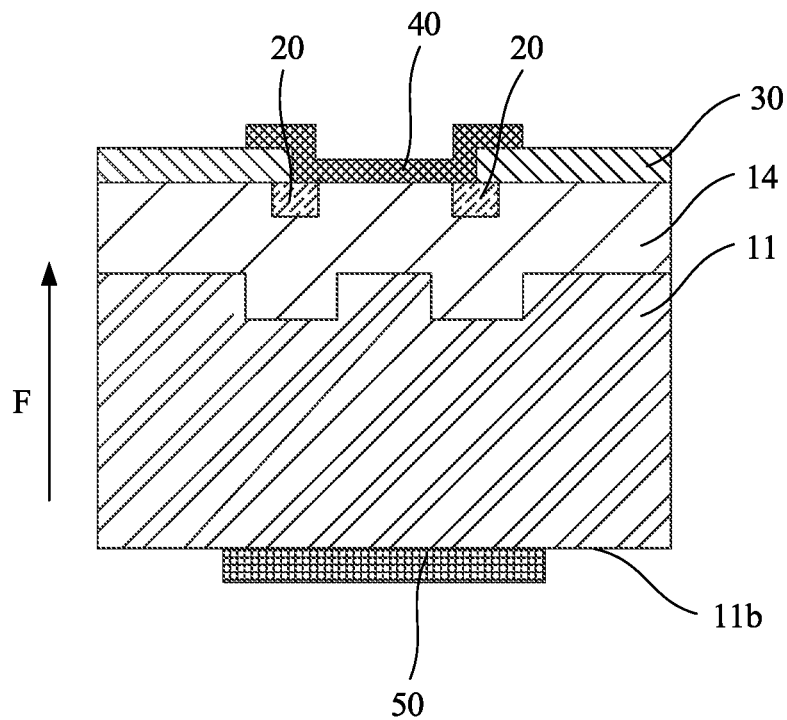

At step 600, as shown in FIG. 2(g), a first electrode is formed on a part of the passivation layer 30 and in the third groove 31, to partially in contact with the part of the P-type semiconductor layer 20 in the second grooves 15, and to in contact with the N-type lightly doped layer 14 between the two adjacent second grooves 15, and the first electrode is an anode 40

A second electrode is formed on the back side 11a of N-type heavily doped layer 11, and the second electrode is a cathode 50. The present disclosure does not particularly limit the first electrode and the second electrode, and different kinds of electrodes may be set according to different kinds of devices.

Figure 3:
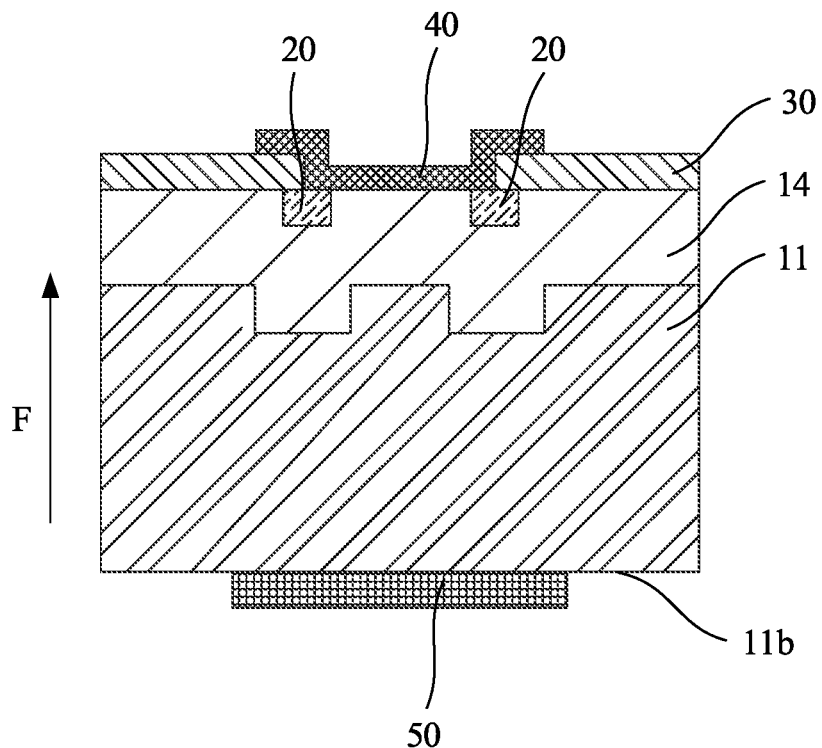
FIG. 3 is a schematic diagram illustrating a vertical device obtained by the method for manufacturing a vertical device in accordance with the first embodiment of the present disclosure.

The structure of the vertical device obtained by the method for manufacturing a vertical device in accordance with the embodiment is shown in FIG. 3.

In the method for manufacturing vertical device according to the above embodiments, the N-type heavily doped layer and the N-type lightly doped layer are made, and the plurality of first grooves are on the front side of the N-type heavily doped layer, such that the second grooves is formed at the position corresponding to the first groove in the N-type lightly doped layer, the non-uniformity caused by etching and the impact on the epitaxial layer are reduced compared to the conventional manufacturing method, and thus the theoretical purpose of the design may be approached more closely, in the process of defect reduction, the conductive conditions are reduced, i.e., the carriers are reduced, and the reverse breakdown voltage is increased.

Second Embodiment

Figure 4A:
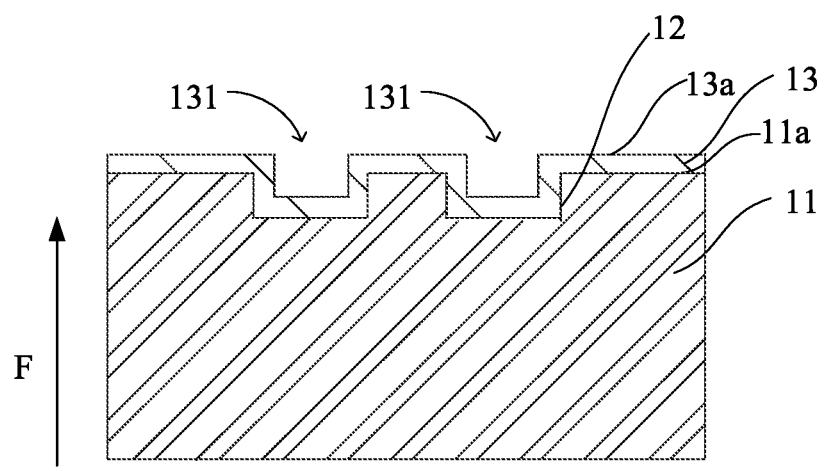
FIGS. 4(a) and 4(b) are a process flow diagram illustrating a method for manufacturing a vertical device in accordance with a second embodiment of the present disclosure.
Figure 4B:
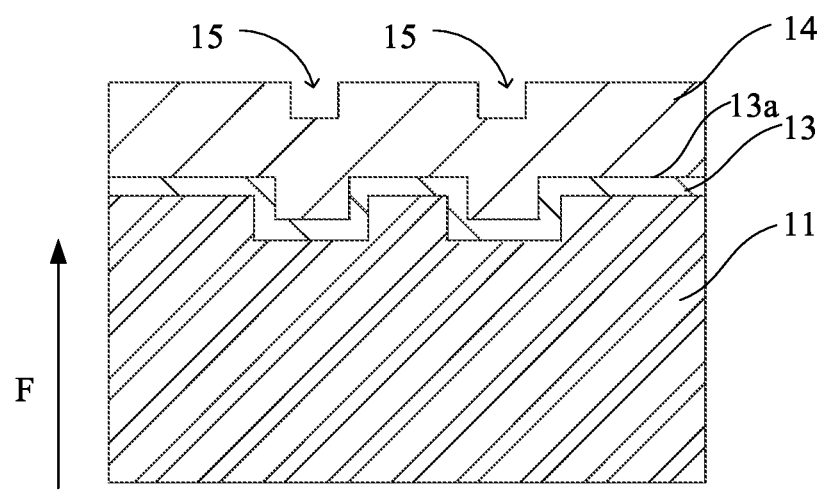

As shown in FIG. 4(a) and FIG. 4(b), a method for manufacturing a vertical device provided by the embodiment is essentially the same as the first embodiment, with the difference that after step 100 and before step 200, the method includes step 150: an N-type buffer layer 13 is formed is formed in the first grooves 12 and on the front side 11a of the N-type heavily doped layer 11, buffer layer grooves 131 are formed in a side of the N-type buffer layer 13 away from the N-type heavily doped layer 11, and the buffer layer grooves 131 are positioned to correspond to the first groove 12, as shown in FIG. 4(a).

the N-type buffer layer 13 is a GaN-based material. The GaN-based N-type buffer layer 13 may be a single-layer structure or a stacking structure. The material of each layer may be GaN, AlGaN or AlInGaN, or other semiconductor materials including Ga atoms, N atoms, or a combination or mixture of at least two of these materials.

Successively, the step 200 of the method for manufacturing a vertical device in the first embodiment is changed to that: an N-type lightly doped layer 14 is formed in the buffer layer grooves 131 and on a front side 13a of the N-type buffer layer 13, and second grooves 15 are formed on a side of the N-type lightly doped layer 14 away from the N-type buffer layer 13, and the second grooves 15 are positioned to correspond to the buffer layer grooves 131, as shown in FIG. 4(b).

Figure 5:
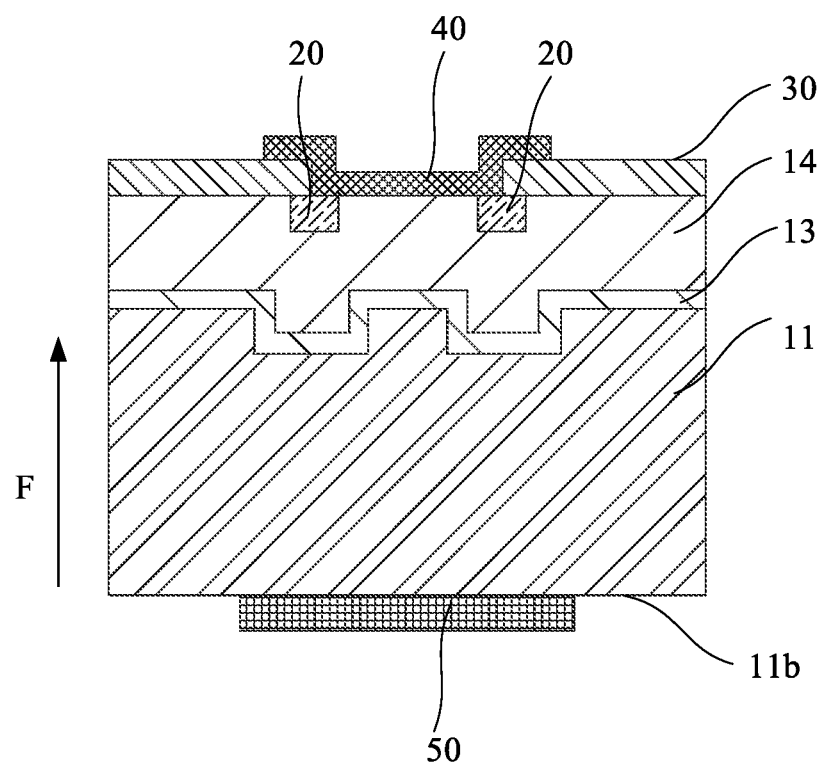
FIG. 5 is a schematic diagram illustrating a vertical device obtained by the method for manufacturing a vertical device in accordance with the second embodiment of the present disclosure.

The structure of the vertical device obtained by the method for manufacturing the vertical device in accordance with the embodiment is shown in FIG. 5.

The above are only some embodiments of the present disclosure, and are not intended to limit the present disclosure. Any modification, equivalent replacement, improvement, etc. made within the spirit and principles of the present disclosure shall be included in the scope of the present disclosure.

The invention claimed is:

1. A method for manufacturing a vertical device, comprising:
    providing an N-type heavily doped layer having a front side and a back side opposite to the front side;
    forming a plurality of first grooves in the front side of the N-type heavily doped layer;
    forming an N-type lightly doped layer in the plurality of first grooves and on the front side of the N-type heavily doped layer;

forming second grooves in a side of the N-type lightly doped layer away from the N-type heavily doped layer, wherein positions of the second grooves correspond to the plurality of first grooves;

forming a P-type semiconductor layer in the second grooves and on a front side of the N-type lightly doped layer;

forming a planarized structure by planarizing the P-type semiconductor layer during which a part of the P-type semiconductor layer located on the front side of the N-type lightly doped layer is removed and only a part of the P-type semiconductor layer located in the second grooves is retained;

forming a passivation layer on the planarized structure;

forming a third groove in the passivation layer, wherein the third groove is located on the part of the P-type semiconductor layer in the second grooves, and on the N-type lightly doped layer between two adjacent second grooves of the second grooves, and the third groove has a depth equal to a thickness of the passivation layer;

forming a first electrode on a part of the passivation layer and in the third groove, to partially in contact with the part of the P-type semiconductor layer in the second grooves, and to in contact with the N-type lightly doped layer between two adjacent second grooves of the second grooves; and forming a second electrode on the back side of N-type heavily doped layer.

2. The method for manufacturing vertical device according to claim 1, wherein the second grooves are formed during growth of the N-type lightly doped layer.

3. The method for manufacturing vertical device according to claim 1, wherein the N-type heavily doped layer has a doping concentration greater than $10^{18}/cm^3$, and the N-type lightly doped layer has a doping concentration less than $10^{18}/cm^3$.

4. The method for manufacturing vertical device according to claim 1, wherein a buffer layer is provided between the N-type heavily doped layer and the N-type lightly doped layer.

5. The method for manufacturing vertical device according to claim 1, wherein at the step of forming the third groove in the passivation layer, the third groove is formed by etching.

6. The method for manufacturing vertical device according to claim 1, wherein the N-type heavily doped layer is a GaN-based material; and/or, the N-type lightly doped layer is a GaN-based material; and/or, the P-type semiconductor layer is a GaN-based material.

7. The method for manufacturing vertical device according to claim 1, wherein materials of the N-type heavily doped layer, the N-type lightly doped layer and the P-type semiconductor layer are all the same or different from each other.

8. The method for manufacturing vertical device according to claim 1, wherein chemical mechanical polishing is used to planarize the P-type semiconductor layer.

* * * * *